United States Patent
Suehiro et al.

(10) Patent No.: US 6,300,678 B1
(45) Date of Patent: *Oct. 9, 2001

(54) I/O PIN HAVING SOLDER DAM FOR CONNECTING SUBSTRATES

(75) Inventors: Mitsuo Suehiro; Satoshi Osawa; Shunichi Kikuchi, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/184,081

(22) Filed: Nov. 2, 1998

Related U.S. Application Data

(63) Continuation-in-part of application No. 09/044,177, filed on Mar. 19, 1998, now abandoned.

(30) Foreign Application Priority Data

Oct. 3, 1997 (JP) .................................................. 9-271645
Jul. 8, 1998 (JP) ................................................. 10-193280

(51) Int. Cl.⁷ .................................................. H01L 23/48
(52) U.S. Cl. ......................... 257/697; 257/667; 257/690; 257/692; 257/726; 257/736; 257/739; 257/750; 257/766; 257/772; 257/779
(58) Field of Search ............................... 257/667, 739, 257/736, 750, 766, 772, 779, 690, 697, 692, 726

(56) References Cited

U.S. PATENT DOCUMENTS

| | | | |
|---|---|---|---|
| 4,949,455 | 8/1990 | Nakamura et al. | 29/843 |
| 5,041,901 * | 8/1991 | Kitano et al. | 357/70 |
| 5,061,552 * | 10/1991 | Satou | 428/209 |
| 5,145,104 | 9/1992 | Apap et al. | 228/180.1 |
| 5,334,804 * | 8/1994 | Love et al. | 174/267 |
| 5,410,807 | 5/1995 | Bross et al. | 29/843 |
| 5,533,665 | 7/1996 | Sinclair et al. | 228/180.1 |
| 5,642,261 | 6/1997 | Bond et al. | 361/704 |
| 5,912,510 | 6/1999 | Hwang et al. | 257/778 |

FOREIGN PATENT DOCUMENTS

| | | | |
|---|---|---|---|
| 52-51569 | 4/1977 | (JP) . | |
| 53-29669 | 3/1978 | (JP) . | |
| 57-210638 | 12/1982 | (JP) . | |
| 58-35996 | 3/1983 | (JP) . | |
| 62-165960 | 7/1987 | (JP) . | |
| 63-74657 | 4/1988 | (JP) . | |
| 2-47890 | 2/1990 | (JP) . | |
| 2187045 * | 7/1990 | (JP) | H01L/21/60 |
| 2-194691 | 8/1990 | (JP) . | |
| 2-205060 | 8/1990 | (JP) . | |
| 3-280456 | 12/1991 | (JP) . | |
| 6-97341 | 4/1994 | (JP) . | |
| 6-132642 | 5/1994 | (JP) . | |
| 63-120450 | 5/1998 | (JP) . | |

* cited by examiner

*Primary Examiner*—Eddie Lee
*Assistant Examiner*—Matthew E. Warren
(74) *Attorney, Agent, or Firm*—Armstrong, Westerman, Hattori, McLeland & Naughton, LLP

(57) ABSTRACT

There is provided an I/O pin by which an MCM is positively prevented from being damaged by solder flowing from the fore end to the base of the I/O pin when the I/O pin is soldered in the case of mounting the MCM. An I/O pin used for an electrical connection is provided, one end of which is perpendicularly fixed to an MCM and the other end of which is soldered to a predetermined position on the mother board in the case of mounting the MCM on the mother board. In an intermediate portion of the I/O pin, there is formed a solder dam composed of a plated layer of Ni of low solder wettability, a layer of highly heat-resistant resin or a layer of high-temperature solder.

12 Claims, 11 Drawing Sheets

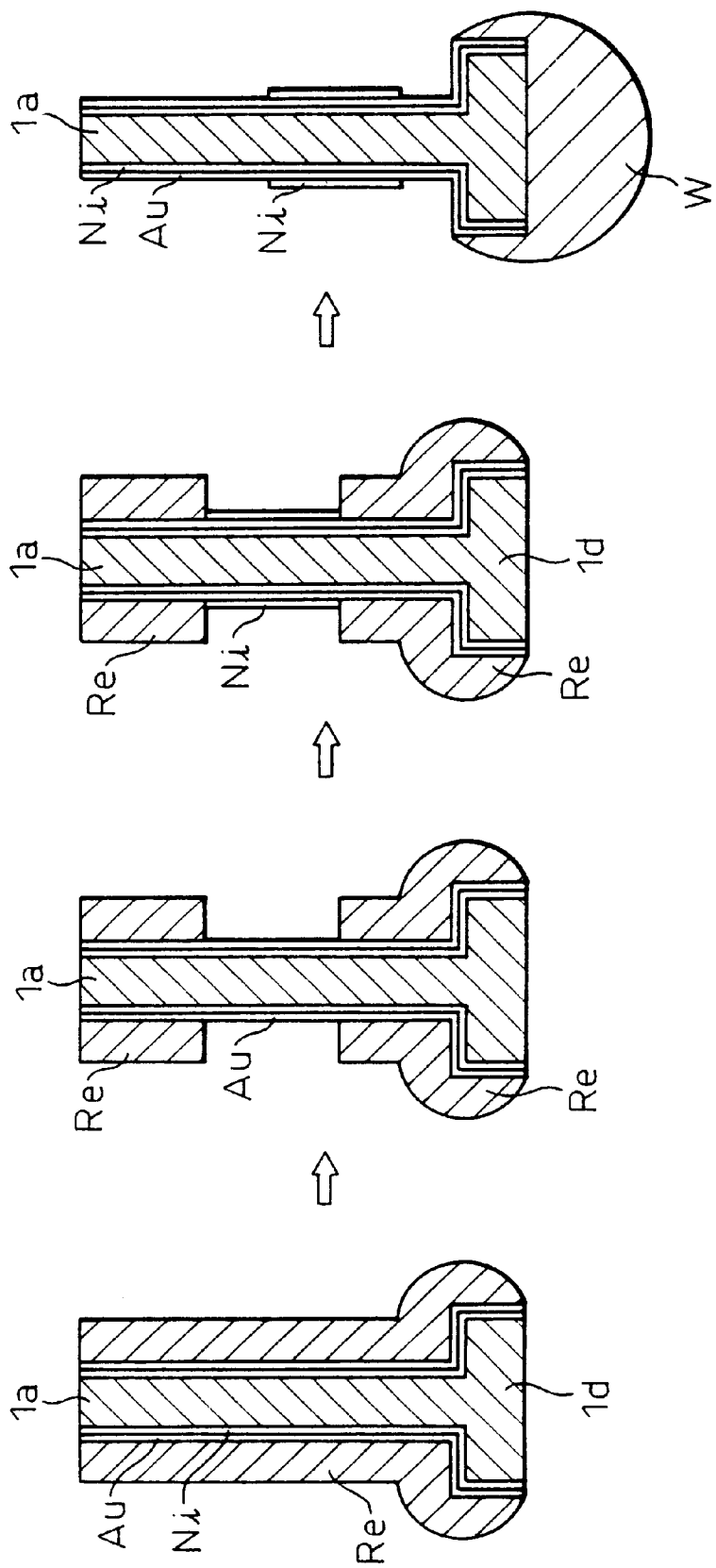

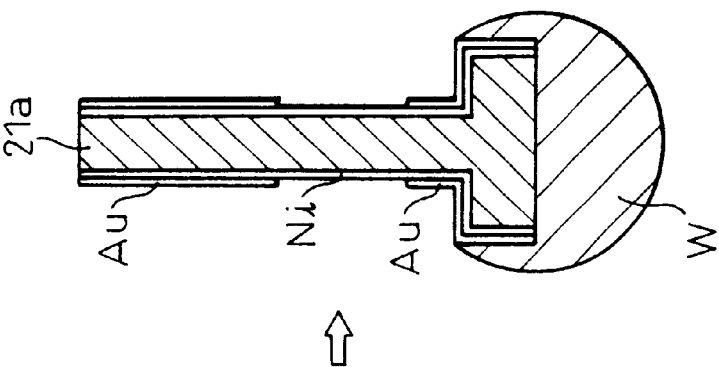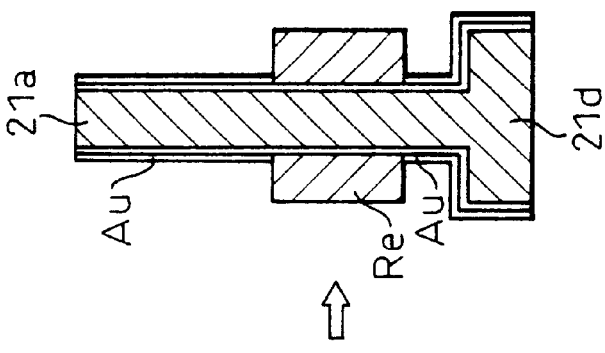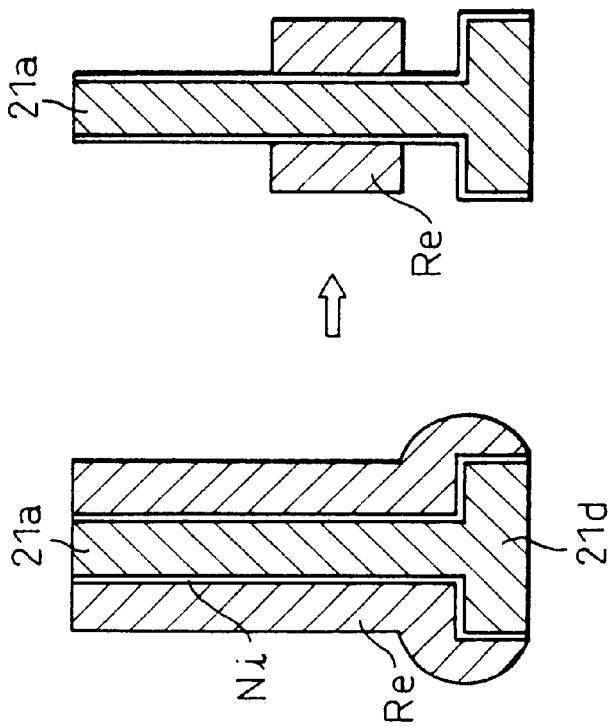

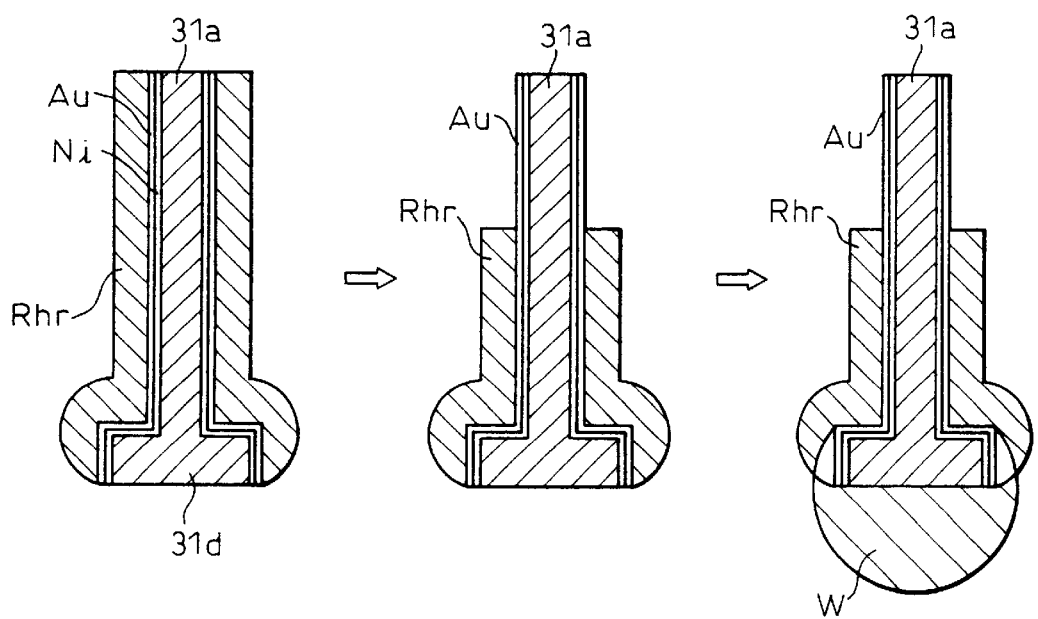

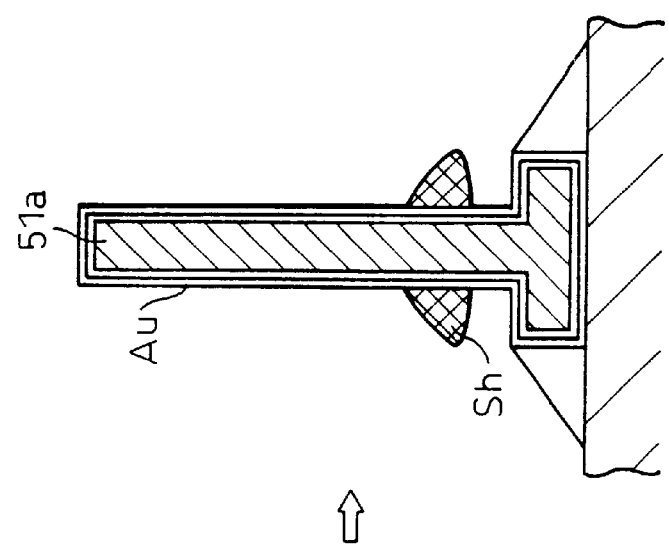
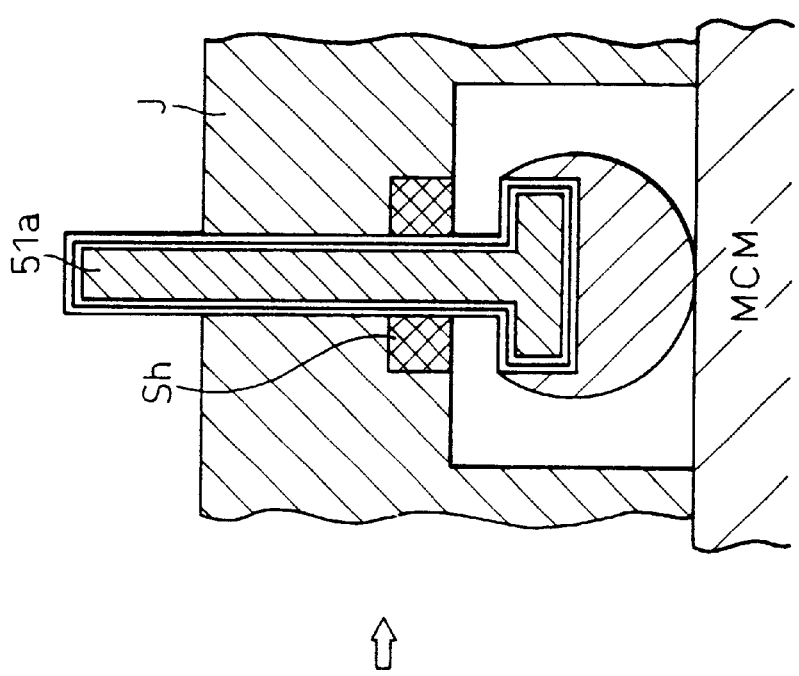
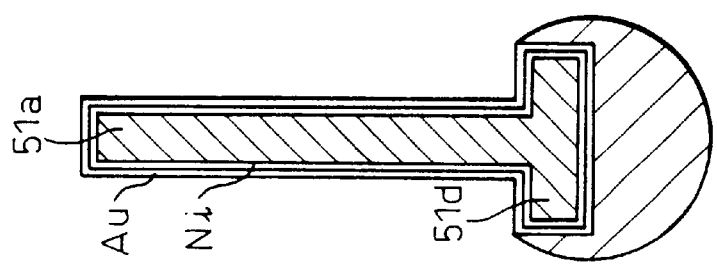

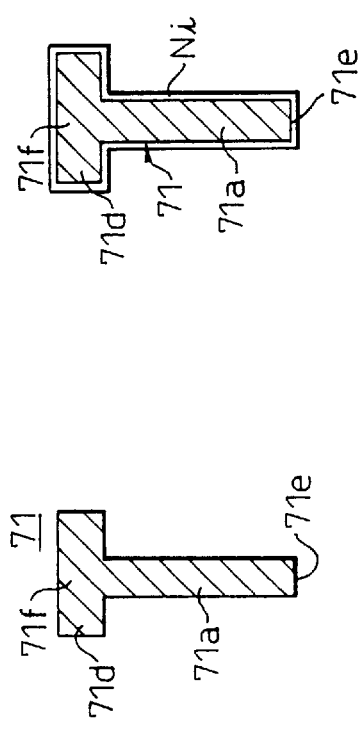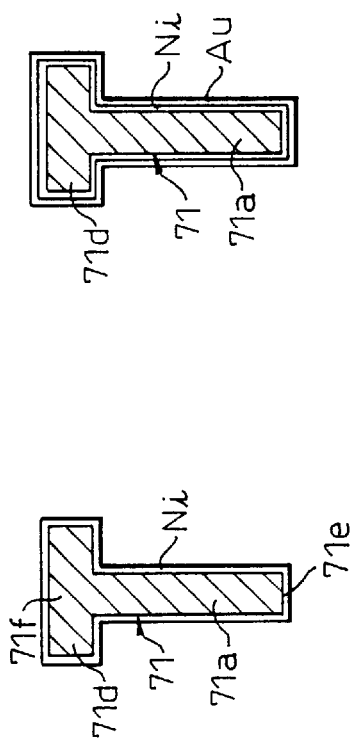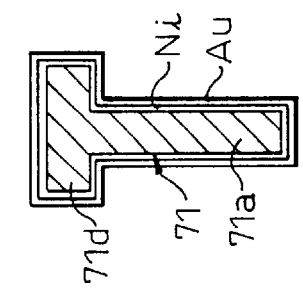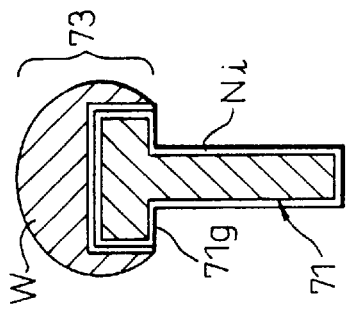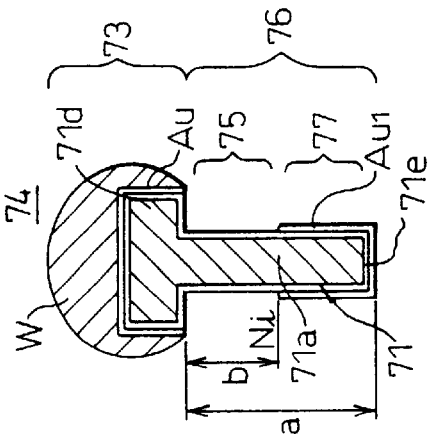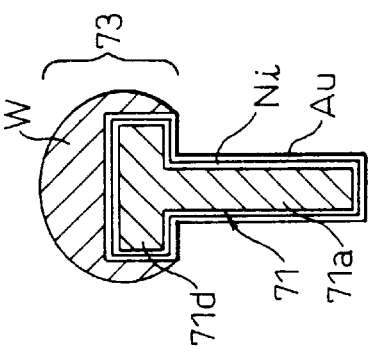

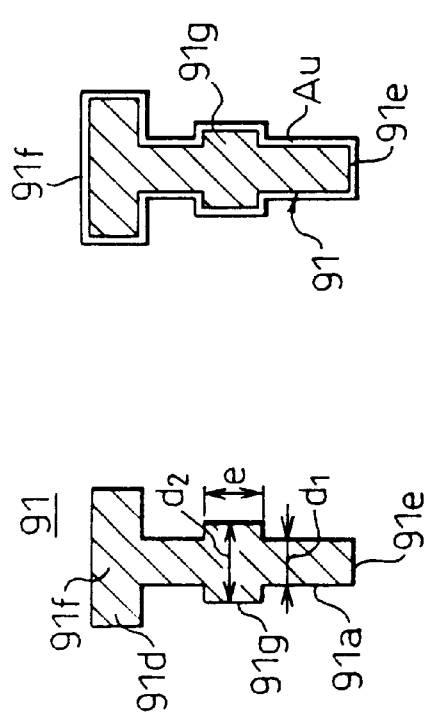

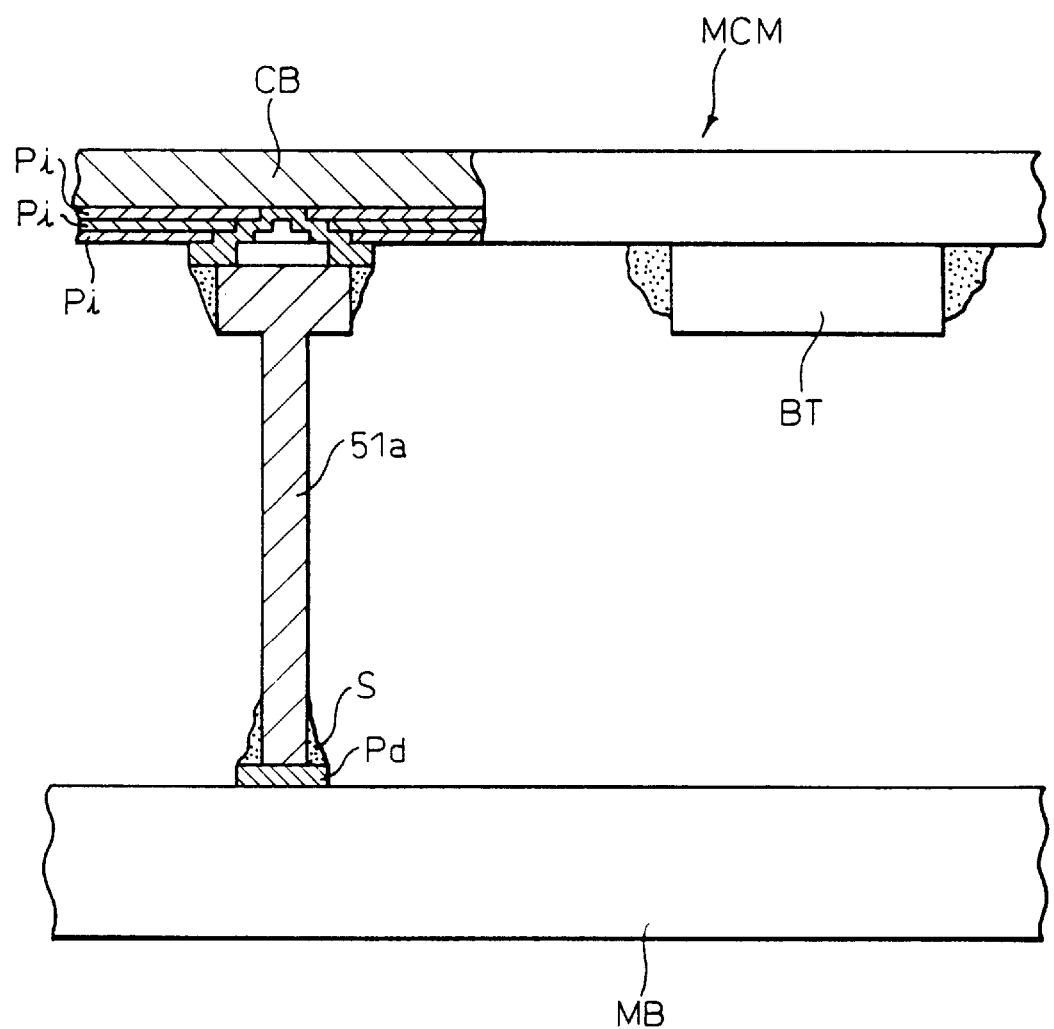

I/O PIN HAVING SOLDER DAM FOR CONNECTING SUBSTRATES

CROSS REFERENCE TO RELATED APPLICATION

This application is a continuation-in-part application of Ser. No. 09/044,177 filed on Mar. 19, 1998 now abandoned.

BACKGROUND OF THE INVENTION

1. Field of the Invention

The present invention relates to an I/O pin used for electrically connecting printed boards characterized in that one end of the I/O pin is perpendicularly secured onto one printed board, and the other end of the I/O pin is soldered to a predetermined position on the other printed board when the one printed board is mounted on the other printed board.

2. Description of the Related Art

A multichip module, which will be referred to as MCM hereinafter in this specification, composed of a small printed board on which semiconductor elements (bare chips) are mounted is mounted onto a large printed board (mother board) via a large number of I/O pins, the diameter of which is approximately 0.2 mm and the length of which is approximately 3 mm.

FIG. 11 is a view showing a primary portion of an example of the structure in which the small printed board is mounted onto the large printed board.

Referring to the drawing, on the surface of mother board MB, a plurality of disk-shaped pads Pd are formed by means of etching, wherein only one disk-shaped pad Pd is shown in the example shown in the drawing. On the pad Pd, a layer of solder S and a layer of flux (not shown in the drawing) are laminated in this order.

On the other hand, an MCM includes: a ceramic substrate CB on which six layers (three layers in the example shown in the drawing) of polyimide Pi are usually formed, between which wiring layers are interposed; a plurality of bare chips (semiconductor elements) BT (one bare chip is shown in the example shown in the drawing) mounted on the ceramic substrate; and I/O pins 51a, the number of which may be several hundred to several thousand (one I/O pin is shown in the example shown in the drawing), by which an MCM and a mother board are connected to each other.

When an MCM is mounted on a mother board MB, I/O pin 51a collides with pad Pd, which corresponds to I/O pin 51a, and is temporarily attached to mother board MB by a layer of flux. After that, I/O pin 51a is soldered (secured) to the corresponding pad Pd by solder S which is melted by a reflow treatment.

When an MCM is mounted on a mother board MB, the following problems may be encountered. Solder S creeps upward along I/O pin 51a, that is, solder S flows from a fore end to a base of the I/O pin and extends to the polyimide layers Pi on MCM. At this time, solder S intrudes between the polyimide layers Pi. Therefore, the MCM suffers damage that can not be repaired.

When MCM is heated so that it can be detached from mother board MB, there is caused a problem that solder S flows, that is, solder S creeps upward, and this phenomenon was described before.

Further, when bare chip BT is detached after MCM has been removed, solder S depositing at the fore end of I/O pin flows to the base side of I/O pin, that is, solder S creeps upward, and the same problem may be encountered.

In this connection, techniques disclosed in the patent publications relating to the present application will be briefly introduced as follows.

Japanese Unexamined Patent Publication No. 63-74657 discloses a soldering structure by which IC for driving and a substrate are soldered to each other. In this structure, there is provided a layer (dam) for preventing the diffusion of solder in the periphery of the pad portion of the substrate.

Japanese Unexamined Patent Publication No. 62-165960 discloses a structure of soldering in which a surface mounting J-bend type IC such as PLCC (Plastic Leaded Chip Carrier) and a substrate are soldered to each other. At the base portions of a large number of leads, which are bent into a J-shape, there are formed layers (dams) made of resin for preventing solder from creeping upward.

Japanese Unexamined Patent Publication No. 52-51569 discloses a method of manufacturing a substrate of polyimide. On a copper layer pattern formed on the substrate, a layer (dam) for preventing the diffusion of solder is formed by the photo-resist method.

Japanese Unexamined Patent Publication No. 2-187045 discloses a structure of the pad arranged on the substrate on which IC chips are mounted. In this structure, an oxide film (dam) of low solder wettability is formed in the periphery of the pad by heat treatment.

Japanese Unexamined Patent Publication No. 2-47890 discloses a structure of a circular pad on the substrate with which the pins of electronic parts are made to collide. A small circular layer (dam) made of material, to which no solder adheres, is formed at the center of the pad so that the pin can be aligned.

Japanese Unexamined Patent Publication No. 58-35996 discloses a structure of a substrate having a through-hole into which a pin insertion type IC is inserted. On a surface of the substrate opposite to the side on which IC is mounted, a sublimation type solder-resist (polyurethane) is coated for the prevention of diffusion of solder.

SUMMARY OF THE INVENTION

It is a primary object of the present invention to provide an I/O pin capable of safely and positively preventing solder from flowing from the fore end to the base of the I/O pin.

In order to accomplish the above object, the present invention provides an I/O pin, for connecting substrates, comprising a solder dam capable of preventing solder from flowing from one end to the other end of the I/O pin in the longitudinal direction, the solder dam being arranged in an intermediate portion of the I/O pin in the longitudinal direction.

It is preferable that one end of the I/O pin is perpendicularly fixed onto a small printed board, and the other end of the I/O pin is soldered to a predetermined position on a large printed board when the small printed board is mounted on the large printed board.

It is preferable that the small printed board is a multichip module on which at least one bare chip is mounted, the large printed board is a mother board and the I/O pin is formed into a rod-shape. Also, it is preferable that the solder dam is composed of a layer made of material of low solder wettability which is arranged on an outer circumference of the intermediate portion of the I/O pin. Also, it is preferable that the layer of low solder wettability is a layer on which Ni is plated. Also, it is preferable that the solder dam is composed of a layer made of a highly heat-resistant resin arranged on an outer circumference of the intermediate portion of the I/O pin. Also, it is preferable that the solder dam is composed of a layer of high temperature arranged on an outer circumference of the intermediate portion of the I/O pin. It is preferable that the I/O pin further comprises: an electrically conductive body; a first covering layer made of material of low solder wettability arranged on an outer circumference of the body; and a second covering layer made of material of high solder wettability arranged on an outer circumference of the first covering layer, wherein a portion of the first covering layer exposed when the second covering layer in the intermediate portion of the I/O pin is removed composes the solder dam. It is preferable that the I/O pin further comprises: an electrically conductive body; a first covering layer made of material of low solder wettability arranged on an outer circumference of the body; and a second covering layer made of material of high solder wettability arranged on an outer circumference of the first covering layer, wherein the second covering layer is not formed in an intermediate portion of the I/O pin in the process of formation of the second covering layer, and a portion of the first exposed covering layer forms a solder dam.

According to the present invention, even if solder creeps upward when an I/O pin is soldered at a predetermined position on the large printed board in the case of mounting the small printed board on the large printed board, solder can be positively prevented from flowing by the action of the solder dam formed in the intermediate portion of I/O pin.

According to the present invention, there is provided a printed board comprising at least one I/O pin used for electrically connecting substrates, said I/O pin comprising a solder dam capable of preventing solder from flowing from one end to the other end of the I/O pin in the longitudinal direction, the solder dam being arranged in an intermediate portion of the I/O pin in the longitudinal direction.

BRIEF DESCRIPTION OF THE DRAWINGS

These and other objects of the present invention will become apparent from the following detailed description of the preferred embodiment of the invention, taken in connection with the accompanying drawings.

In the drawings:

FIGS. 1A–1D are views showing a primary process of the first method of manufacturing a solder dam, wherein FIG. 1A is a view showing a pin member covered with a sublimation type resin, FIG. 1B is a view showing a pin member from which a sublimation type resin is partially removed, FIG. 1C is a view showing a pin member on which a metallic layer of low solder wettability is formed, and FIG. 1D is a view showing a finished product of I/O pin in which a solder dam is formed;

FIGS. 2A–2D are views showing a primary process of the second method of manufacturing a solder dam, wherein FIG. 2A is a view showing a pin member covered with sublimation type resin, FIG. 2B is a view showing a pin member from which sublimation type resin is partially removed, FIG. 2C is a view showing a pin member on which a metallic layer of low solder wettability is formed, and FIG. 2D is a view showing a finished product of an I/O pin in which a solder dam is formed;

FIGS. 3A–3C are views showing a primary process of the third method of manufacturing a solder dam, wherein FIG. 3A is a view showing a pin member covered with highly heat-resistant type resin, FIG. 3B is a view showing a pin member from which highly heat-resistant type resin is partially removed, and FIG. 3C is a view showing a finished product of I/O pin in which a solder dam is formed;

FIGS. 4A–4D are views showing a primary process of the fourth method of manufacturing a solder dam, wherein FIG. 4A is a view showing a pin member covered with highly heat-resistant type resin, FIG. 4B is a view showing a pin member from which highly heat-resistant type resin is partially removed, FIG. 4C is a view showing a pin member on which a metallic layer of high solder wettability is formed, and FIG. 4D is a view showing a finished product of I/O pin in which a solder dam is formed;

FIGS. 5A–5C are views showing a primary process of the fifth method of manufacturing a solder dam, wherein FIG. 5A is a view showing a conventional I/O pin, FIG. 5B is view showing an I/O pin which is set in a securing jig, and FIG. 5C is a view showing an I/O pin soldered to MCM, wherein a solder dam is formed in the I/O pin;

FIGS. 6A–6C are views showing a primary process of the sixth method of manufacturing a solder dam, wherein FIG. 6A is a view showing an I/O pin plated with nickel, FIG. 6B is a view showing an I/O pin which is set in a fixing jig, and FIG. 6C is a view showing an I/O pin in which a solder dam is formed, wherein a solder dam is formed in the I/O pin;

FIGS. 7A–7F are views showing a primary process of the seventh method of manufacturing a solder dam;

FIGS. 9A–9D are views showing a primary process of the ninth method of manufacturing a solder dam;

FIG. 11 is a view showing a primary portion of an example of the mounting structure in which an MCM having a conventional I/O pin is mounted on a mother board.

DESCRIPTION OF THE PREFERRED EMBODIMENTS

Figures 4A, 4B, 4C, 4D:
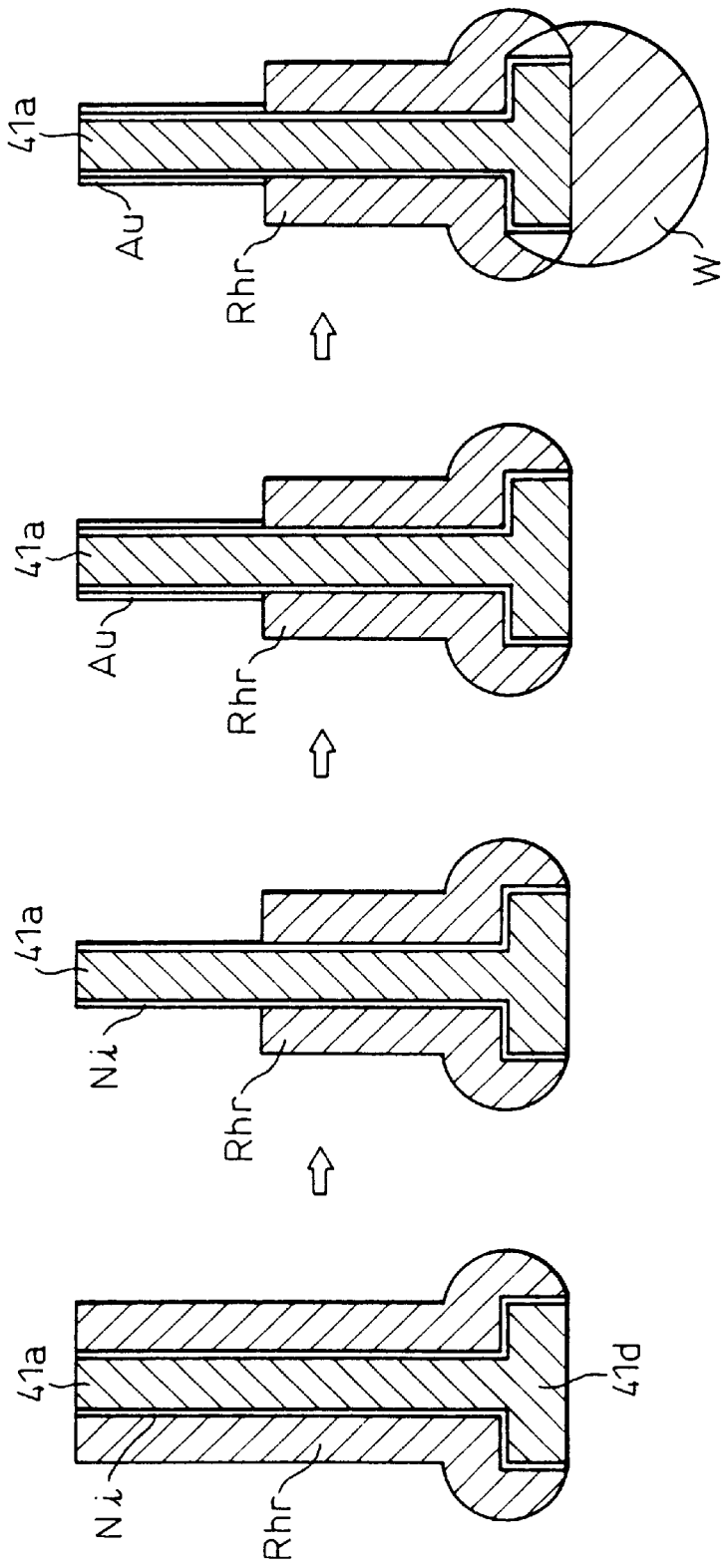

Referring to the accompanying drawings, a plurality of embodiments of the present invention will be explained below.

An I/O pin of this embodiment is composed in such a manner that one end portion of the I/O pin is perpendicularly secured to a multi-module (MCM) composed of a small printed board on which at least one bare chip is mounted and an electrical circuit is formed by a thin film forming technique. When an MCM is mounted on a large printed board (mother board), the other end of I/O pin is made to collide with a corresponding pad on the mother board and soldered (secured) to it. For example, an I/O pin is a rod-shaped electrical connecting element, the diameter of which is approximately 0.2 mm and the length of which is approximately 3 mm.

Various solder dams are formed in the intermediate portion of I/O pin by a plurality of manufacturing methods, which will be described below, so that solder can be prevented from flowing from the fore end to the base of I/O pin, that is, solder can not creep upward along the I/O pin.

FIRST SOLDER DAM MANUFACTURING METHOD

First, an outer circumferential surface of the long and slender rod-shaped pin member made of copper composing the main body (mother metal) of an I/O pin is plated with nickel Ni. Next, it is plated with gold Au. Further, it is covered with a sublimation type resin Re (for example, polyurethane) by the method of manufacturing a covered wire. The thus obtained pin member is cut to a predetermined length, for example, 3 mm, and a base 1d of large diameter is formed at one end of the thus obtained pin member 1a by the method of header machining as shown in FIG. 1A.

The sublimation type resin covering Re, the length of which is predetermined (for example, the length is 1 mm), is removed from a portion of the pin member 1a which is distant from the other end of the pin member 1a, the other end being located on the opposite side to the side of the base 1d, by a predetermined length (for example, 1 mm) by means of irradiating laser beams. In this way, a portion plated with gold is exposed in this portion of the pin member 1a as shown in FIG. 1B.

On the outer circumferential surface of this portion plated with gold Au, a layer of metal, the solder wettability of which is low, for example, a plated layer of nickel Ni, is formed as shown FIG. 1C.

Finally, in order to complete the manufacture of an I/O pin, a solder member W made of Au-Sn is attached to the end surface of the pin on the side of the base 1d. At this time, the sublimation type resin Re sublimates and disappears by the thermal effect, and an exposed layer of nickel Ni which is provided on the outer circumferential surface of the intermediate portion of I/O pin is oxidized and changed into an oxide film as shown in FIG. 1D.

Since the solder wettability of this oxide film is very low (poor), it functions as a solder dam very efficiently. In order to confirm the function as a solder dam, an MCM provided with this I/O pin was attached to and detached from the mother board. As a result of the above experiment, it was confirmed that the solder dam (oxide film) of this I/O pin perfectly prevented solder from creeping upward, that is, the solder dam of this I/O pin perfectly prevented solder from flowing. In other words, it was confirmed by the experiment that the solder dam effect of this I/O pin was excellent.

In this connection, after the above sublimation type resin Re has been removed, the exposed plated layer of gold Au may be removed, so that the under-layer of Ni-plated layer can be exposed, and this the under-layer of Ni-plated layer may be made to function as a solder dam.

In this connection, after the above sublimation type resin Re has been removed, on the exposed layer of gold Au or on the layer of nickel Ni which is exposed when the layer of gold Au is removed, a layer of resin of high heat-resistance, for example, a layer of polyimide or nylon 66 may be provided, so that this covering layer can be made to function as a solder dam.

SECOND SOLDER DAM MANUFACTURING METHOD

First, an outer circumferential surface of the long and slender rod-shaped pin member made of copper composing the main body (mother metal) of an I/O pin is plated with nickel Ni. Next, it is covered with a sublimation type resin Re (for example, polyurethane) by the method of manufacturing a covered wire. The thus obtained pin member is cut to a predetermined length, for example, 3 mm, and a base 21d of large diameter is formed at one end of the thus obtained pin member 1a by the method of header machining as shown in FIG. 2A.

The sublimation type resin covering Re, the length of which is predetermined (for example, the length is 1 mm), is left in a portion of the pin member 2a which is distant from the other end of the pin member 21a by a predetermined length (for example, 1 mm), and the sublimation type resin Re of other portions is removed by means of irradiating laser beams as shown in FIG. 2B.

On the outer circumferential surface of this removed portion, a layer of metal, the solder wettability of which is high, for example, a plated layer of gold Au, is formed as shown FIG. 2C.

Finally, in order to complete the manufacture of an I/O pin, solder member W made of Au-Sn is attached to the end surface of the pin on the side of the base. At this time, the polyurethane covering sublimates and disappears by the thermal effect, and a layer of nickel Ni which functions as a solder dam is exposed as shown in FIG. 2D.

The same experiment as that described before was made with respect to this I/O pin. As a result of the experiment, it was recognized that the solder dam of this I/O pin could provide an excellent effect.

THIRD SOLDER DAM MANUFACTURING METHOD

First, an outer circumferential surface of the long and slender rod-shaped pin member made of copper composing the main body (mother metal) of an I/O pin is plated with nickel Ni. Next, it is plated with gold Au. Further, it is covered with a highly heat-resistant type resin Rhr (for example, polyimide or nylon 66). The thus obtained pin member is cut to a predetermined length, for example, 3 mm, and a base 31d of large diameter is formed at one end of the thus obtained pin member 31a by the method of header machining as shown in FIG. 3A.

Highly heat-resistant type resin coating Rhr in a portion located by a predetermined distance (for example, 1.5 mm) from the other end of the pin member 31a is removed, for example, by means of irradiating laser beams, so that a plated layer of gold Au is exposed as shown in FIG. 3B. Highly heat-resistant type resin covering, which has not been removed at this time, functions as a solder dam.

Finally, in order to complete the manufacture of I/O pin, solder member W made of Au—Sn is attached to the end surface of the pin on the side of the base as shown in FIG. 3C.

FOURTH SOLDER DAM MANUFACTURING METHOD

First, an outer circumferential surface of the long and slender rod-shaped pin member made of copper composing the main body (mother metal) of an I/O pin is plated with nickel Ni. Next, it is covered with a highly heat-resistant type resin Rhr (for example, polyimide or nylon 66). The thus obtained pin member is cut to a predetermined length, for example, 3 mm, and a base 41d of large diameter is formed at one end of the thus obtained pin member 41a by the method of header machining as shown in FIG. 4A.

A highly heat-resistant type resin coating Rhr in a portion located by a predetermined distance (for example, 1.5 mm) from the other end of the pin member 41a is removed by, for example, means of irradiating laser beams as shown in FIG. 4B.

A plated layer of gold Au is formed on the other end of the pin member from which the highly heat-resistant type resin covering Rhr is removed as shown in FIG. 4C. The highly heat-resistant type resin coating Rhr, which has not been removed, and the plated layer of nickel Ni both function as solder dams.

Finally, in order to complete the manufacture of an I/O pin, solder member W made of Au-Sn is attached to the end surface of the pin on the side of the base as shown in FIG. 4D.

FIFTH SOLDER DAM MANUFACTURING METHOD

When a finished product of the conventional an I/O pin 51a of Cu—Ni/Au shown in FIG. 5A is used and soldered perpendicularly to MCM, a ring-shaped high-temperature solder member S of made of Ag—Sn is previously set in a hole formed in a securing jig made of carbon into which I/O pin 51a is inserted as shown in FIG. 5B.

When this I/O pin 51a is fixed perpendicularly, the high-temperature solder Sh is fused and deposited on an intermediate portion of I/O pin 51a, and this deposition of solder can function as a solder dam (FIG. 5C).

SIXTH SOLDER DAM MANUFACTURING METHOD

Figure 6A:
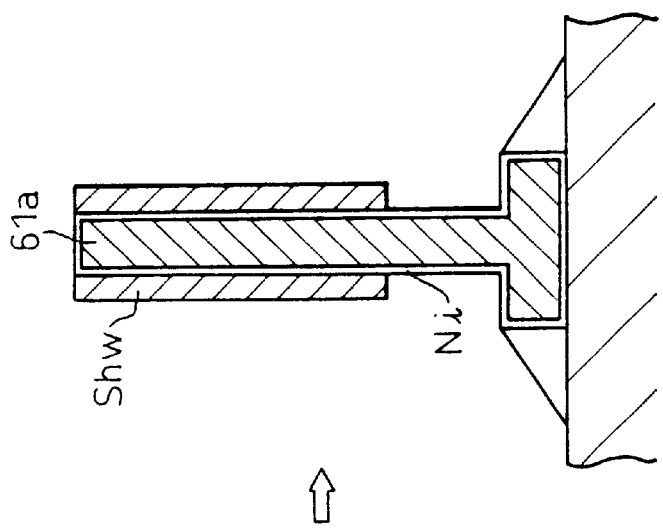

First, an outer circumferential surface of the long and slender rod-shaped pin member made of copper composing the main body (mother metal) of an I/O pin is plated with nickel Ni. Next, the thus obtained pin member is cut to a predetermined length, for example, 3 mm, and a base 61d of large diameter is formed at one end of the thus obtained pin member 61a by the method of header machining. On the end surface of the pin on the base side, a solder member W of Au—Sn is attached. In this way, I/O pin 61a shown in FIG. 6A is prepared.

Figure 6B:
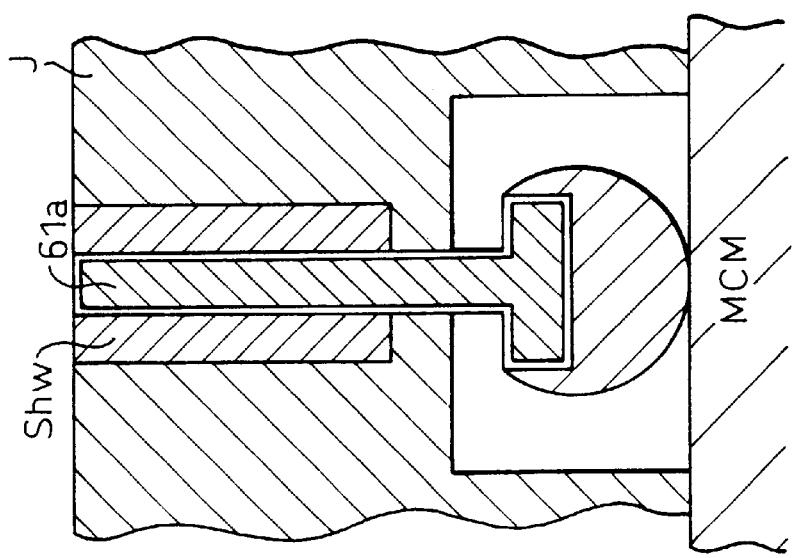

When this I/O pin 61a is secured perpendicularly to MCM, a pipe-shaped high-temperature solder member Shw made of Ag—Sn is previously set in a hole formed in a securing jig made of carbon into which I/O pin 61a is inserted as shown in FIG. 6B.

Figure 6C:
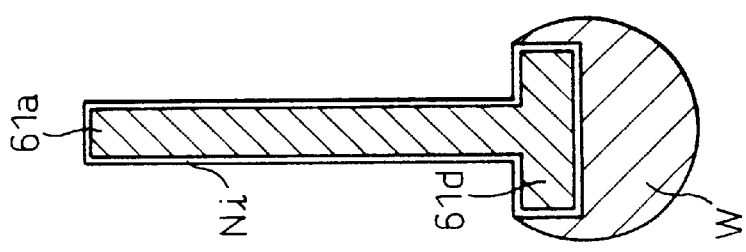

When this I/O pin 61a is fixed perpendicularly, the high-temperature solder is fused and deposited to the fore end portion of I/O pin, and a plated layer of nickel Ni on the base side is oxidized and changed into an oxide film, which can function as a solder dam as shown in FIG. 6C.

SEVENTH SOLDER DAM MANUFACTURING METHOD

A long and slender round bar made of copper composing a body (mother metal) of the I/O pin is machined as follows. An end portion of the round bar is machined by a header, so that a mount body portion 71d of large diameter can be formed, and the end portion is cut to a predetermined length, for example, 3 mm. When this operation is repeated, it is possible to obtain a pin body 71 composed of the pin body portion 71a and the mount body 71d arranged at one end portion of this pin body portion 71a. Reference numeral 71e is an end surface of the pin body portion 71a, and reference numeral 71f is an end surface of the mount body portion 71d (shown in FIG. 7A).

Next, the overall outer surface of the pin body 71 including both end surfaces 71e, 71f is subjected to nickel Ni plating (shown in FIG. 7B) and then subjected to gold Au plating (shown in FIG. 7C).

Next, solder material W such as Au—Sn is soldered onto the end surface 71f of the mount body 71d. Due to the foregoing, it is possible to form the mount portion 73 in which a layer of gold Au plating in the mount body portion 71d is covered with solder material W (shown in FIG. 7D).

Then, the pin body 71 is dipped in a separate solution. Due to the foregoing, an exposed gold Au plating layer is removed. That is, concerning the pin body portion 71a, the gold Au plating layer is removed, and the nickel Ni plating layer is exposed. Concerning the mount portion 73, the gold Au plating layer is removed only from the lower surface 71g, and the layer of nickel Ni plating is exposed (shown in FIG. 7E).

Finally, only the end portion of the pin body 71a is subjected to non-electrolytic plating by dipping it in a gold Au plating solution, and a gold Au plating layer 1 is formed on the end side of the pin body portion 71a. The gold Au plating layer 1 is formed on the end surface 71e of the pin body portion 71a and on the circumference of the pin body portion 71a on the end side. A portion of the pin body portion 71a in which the gold Au plating layer 1 is not formed, that is, a portion in which the nickel Ni plating layer is exposed composes the solder dam 75 (shown in FIG. 7F).

In this way, manufacturing of the I/O pin 74 having the solder dam is completed. The I/O pin 74 is composed of a pin portion 76 and a mount portion 73 arranged at one end of the pin portion 76, and the solder dam 75 is formed in a portion of the pin portion 76 close to the mount portion 73.

The pin portion 76 is composed of the solder attaching portion 77 arranged on the forward end side, and the solder dam 75 arranged close to the mount potion 73. The solder attaching portion 77 is an essential portion for the pin 76 to be soldered. Therefore, the solder attaching portion 77 including the forward end surface 71e of the pin body 71a is covered with the gold Au plating layer 1. The solder dam 75 is composed of an exposed nickel Ni plating layer, and length of the solder dam 75 is "b". This length "b" is approximately ½ of the length "a" of the pin 76. In the mount portion 73, the mount body 71d, which has been subjected to gold Au plating, is covered with solder W.

EIGHTH SOLDER DAM MANUFACTURING METHOD

Figure 8A:
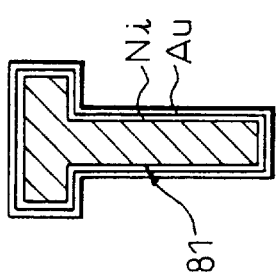
FIGS. 8A–8E are views showing a primary process of the eighth method of manufacturing a solder dam.

A long and slender round bar made of copper composing a body (mother metal) of the I/O pin is machined as follows. An end portion of the round bar is machined by a header, so that a mount body portion 81d of large diameter can be formed, and the end portion is cut to a predetermined length, for example, 3 mm. When this operation is repeated, it is possible to obtain a pin body 81 composed of the pin body portion 81a and the mount body 81d arranged at one end portion of this pin body portion 81a. Reference numeral 81e is an end surface of the pin body portion 81a, and reference numeral 81f is an end surface of the mount body portion 81d (shown in FIG. 8A).

Figure 8B:
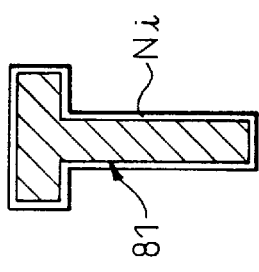
Figure 8C:
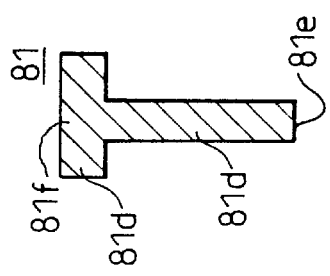

Next, the overall outer surface of the pin body 81 including both end surfaces 81e, 81f is subjected to nickel Ni plating (shown in FIG. 8B) and then subjected to gold Au plating (shown in FIG. 8C).

Figure 8D:
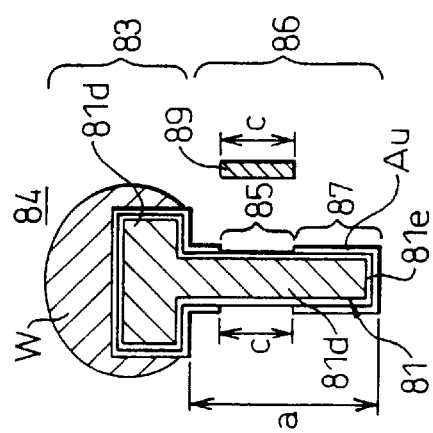

Next, solder material W such as Au–Sn is soldered onto the end surface 81f of the mount body 81d. Due to the foregoing, it is possible to form the mount portion 83 in which a layer of gold Au plating in the mount body portion 81d is covered with solder material W (shown in FIG. 8D).

Figure 8E:
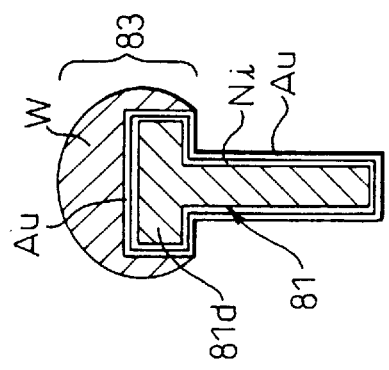

Finally, the pin body is subjected to a polishing machine provided with a polishing belt, the width of which is "c", and the intermediate portion of the pin body 81 is polished by the polishing machine. In this case, a quantity of polishing conducted by the polishing machine is previously determined so that only a layer of gold Au plating can be removed by polishing. After the completion of polishing, the nickel N plating layer is exposed. This portion in which the nickel N plating layer is exposed composes the solder dam 85 (shown in FIG. 8E).

In this way, manufacturing of the I/O pin 84 having the solder dam is completed. The I/O pin 84 is composed of a pin portion 86 and a mount portion 83 arranged at one end of the pin portion 86, and the solder dam 85 is formed in a portion of the pin portion 86 at the substantial center.

The pin portion 86 is composed of the solder attaching portion 87 arranged on the forward end side, and the solder dam 85 arranged at the substantial center. The solder attaching portion 87 is an essential portion for the pin 86 to be soldered. Therefore, the solder attaching portion 87 including the forward end surface 81e of the pin body 81a is covered with the gold Au plating layer. The solder dam 85 is composed of an exposed nickel Ni plating layer, and length of the solder dam 85 is "c". This length "c" is approximately ⅓ of the length "a" of the pin 86. In the mount portion 83, the mount body 81d, which has been subjected to gold Au plating, is covered with solder W.

NINTH SOLDER DAM MANUFACTURING METHOD

A round bar made of nickel Ni is used. A long and slender round bar made of nickel composing a body (mother metal) of the I/O pin is machined as follows. An end portion of the round bar is machined by a header, so that a mount body portion 91d of large diameter can be formed. Then the round bar is fed, for example, by 5 mm and put into a die to form a large diameter portion. After that, the round bar is pressed so that the length of the round bar can be shortened in the longitudinal direction and the large diameter portion 91g can be formed. Then the round bar is cut to a predetermined length, for example 3 mm.

When this operation is repeated, it is possible to obtain the pin body 91 composed of the pin body portion 91a and he mount body 91d arranged at one end of the pin body portion 91a, wherein the large diameter portion 91g is formed at the center of the pin body portion 91a. Diameter d2 of this large diameter portion 91g is larger than diameter d1 of the pin body portion 91a, and length "e" of this large diameter portion 91g is approximately ⅓ of length "a" of the pin body portion 91a. Reference numeral 91e is an end surface of the pin body portion 91a, and reference numeral 91f is an end surface of the mount body 91d (shown in FIG. 9A).

In this connection, it is possible to form the large diameter portion 91g together with the mount body 91d by means of rolling.

Next, the overall outer surface of the pin body 91 including both end surfaces 91e, 91f is subjected to gold Au plating (shown in FIG. 9B).

Next, solder material W such as Au–Sn is soldered onto the end surface 91f of the mount body 91d. Due to the foregoing, it is possible to form the mount portion 93 in which a layer of gold Au plating in the mount body portion 91d is covered with solder material W (shown in FIG. 9C).

Finally, the pin body 91 is subjected to a polishing machine provided with an endless polishing belt, and the large diameter portion 91g of the pin body 91 is polished by the polishing machine, so that the layer of gold Au plating is removed and the pin body 91 made of nickel Ni is exposed. A portion to which the pin body 91 made of nickel Ni is exposed composes the solder dam 95 (shown in FIG. 9D).

In this way, manufacturing of the I/O pin 94 having the solder dam is completed. The I/O pin 94 is composed of a pin portion 96 and a mount portion 93 arranged at one end of the pin portion 96, and the solder dam 95 is formed in a portion of the pin portion 96 at the substantial center.

The pin portion 96 is composed of the solder attaching portion 97 arranged on the forward end side, and the solder dam 95 arranged at the substantial center. The solder attaching portion 97 is an essential portion for the pin 96 to be soldered. Therefore, the solder attaching portion 97 including the forward end surface 91e of the pin body 91a is covered with the gold Au plating layer. The solder dam 95 is composed of an exposed portion of the pin body 91, and length of the solder dam 95 is "e". This length "e" is approximately ⅓ of the length "a" of the pin 96. The length "e" and position of the solder dam 95 are determined by the large diameter portion 91a, that is, the length "e" and position of the solder dam 95 are not affected by fluctuation of the above polishing work. The large diameter portion 91g is determined by a die. Therefore, fluctuation of the length "e" and position is small. For the above reasons, concerning each I/O pin 94 having the solder dam, fluctuation of the length "e" and position of the solder dam 95 is small. In the mount portion 93, the mount body 91d, which has been subjected to gold Au plating, is covered with solder W.

TENTH SOLDER DAM MANUFACTURING METHOD

A round bar made of copper Cu is used. A long and slender round bar made of copper composing a body (mother metal) of the I/O pin is machined as follows. An end portion of the round bar is machined by a header, so that a mount body portion 101d of large diameter can be formed.

Then the round bar is fed, for example, by 5 mm and put into a die to form a large diameter portion. After that, the round bar is pressed so that the length of the round bar can be shortened in the longitudinal direction and the large diameter portion 101g can be formed. Then the round bar is cut to a predetermined length, for example 3 mm.

When this operation is repeated, it is possible to obtain the pin body 101 composed of the pin body portion 101a and the mount body 101d arranged at one end of the pin body portion 101a, wherein the large diameter portion 101g is formed at the center of the pin body portion 101a.

Figure 10A:
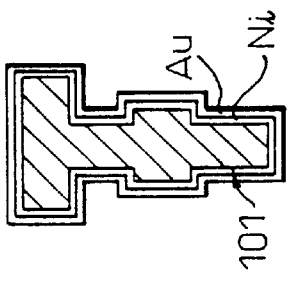
FIGS. 10A–10E are views showing a primary process of the tenth method of manufacturing a solder dam.

Diameter d3 of this large diameter portion 101g is larger than diameter d1 of the pin body portion 101a, and length "f" of this large diameter portion 101g is approximately ⅓ of length "a" of the pin body portion 101a. Reference numeral 101e is an end surface of the pin body portion 101a, and reference numeral 101f is an end surface of the mount body 101d (shown in FIG. 10A).

In this connection, it is possible to form the large diameter portion 101g together with the mount body 101d by means of rolling.

Figure 10B:
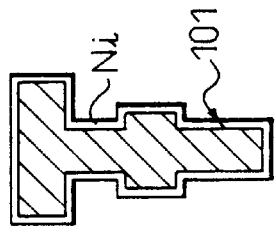
Figure 10C:
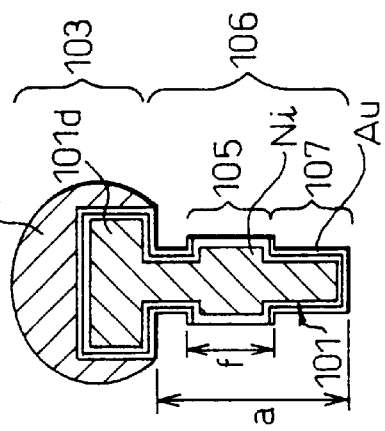

Next, the overall outer surface of the pin body 101 including both end surfaces 101e, 101f is subjected to nickel Ni plating (shown in FIG. 10B). Further, the overall outer surface of the pin body 101 is subjected to gold Au plating (shown in FIG. 10C).

Figure 10D:
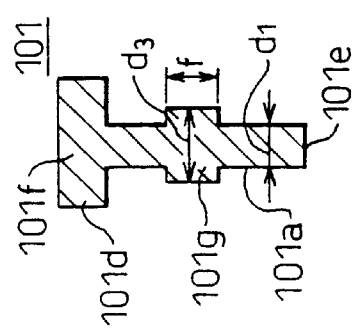

Next, solder material W such as Au–Sn is soldered onto the end surface 101f of the mount body 101d. Due to the foregoing, it is possible to form the mount portion 103 in which a layer of gold Au plating in the mount body portion 101d is covered with solder material W (shown in FIG. 10D).

Figure 10E:
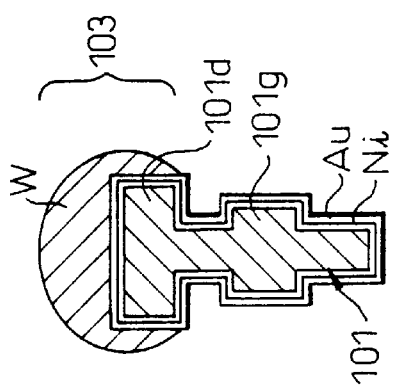

Finally, the pin body 101 is subjected to a polishing machine provided with an endless polishing belt, and the large diameter portion 101g of the pin body 101 is polished by the polishing machine. In this case, a quantity of polishing conducted by the polishing machine is previously determined so that only a layer of gold Au plating can be removed by polishing. After the completion of polishing, the nickel N plating layer is exposed. This portion in which the nickel N plating layer is exposed composes the solder dam 105 (shown in FIG. 10E).

In this way, manufacturing of the I/O pin 104 having the solder dam is completed. The I/O pin 104 is composed of a pin portion 106 and a mount portion 103 arranged at one end of the pin portion 106, and the solder dam 105 is formed in a portion of the pin portion 106 at the substantial center.

The pin portion 106 is composed of the solder attaching portion 107 arranged on the forward end side, and the solder dam 105 arranged at the substantial center. The solder attaching portion 107 is an essential portion for the pin 106 to be soldered. Therefore, the solder attaching portion 107 including the forward end surface 101e of the pin body 101a is covered with the gold Au plating layer. The solder dam 105 is composed of an exposed portion of the pin body 101, and length of the solder dam 105 is "f". This length "f" is approximately ⅓ of the length "a" of the pin 106. The length "f" and position of the solder dam 105 are determined by the large diameter portion 101g, that is, the length "f" and position of the solder dam 105 are not affected by fluctuation of the above polishing work. The large diameter portion 101g is determined by a die. Therefore, fluctuation of the length "f" and position is small. For the above reasons, concerning each I/O pin 104 having the solder dam, fluctuation of the length "f" and position of the solder dam 105 is small. In the mount portion 103, the mount body 101d, which has been subjected to gold Au plating, is covered with solder W.

As described above, according to the present invention, it is possible to provide an I/O pin capable of safely and positively preventing solder from flowing along the pin from the fore end to the base. Therefore, it is becomes possible to extend the life of an MCM.

It is to be understood that the invention is by no means limited to the specific embodiments illustrated and described herein, and that various modifications thereof may be made which come within the scope of the present invention as defined in the appended claims.

What is claimed is:

1. An I/O pin for connecting substrates, comprising:
   an electrically conductive straight body;
   a first covering layer made of material of low solder wettability arranged on an outer circumference to the body;
   a second covering layer made of material of high solder wettability arranged on an outer circumference of the first covering layer, a portion of the first covering layer being exposed from the second covering layer in the intermediate portion of the I/O pin; and
   a solder dam capable of preventing solder from flowing from one end to the other end of the I/O pin in a longitudinal direction, the solder dam being arranged in an intermediate portion of the I/O pin in the longitudinal direction, said solder dam comprising said portion of said first covering layer exposed from said second material layer.

2. The I/O pin according to claim 1, wherein one end of the I/O pin is perpendicularly secured onto a small printed board, and the other end of the I/O pin is soldered to a predetermined position on a large printed board when the small printed board is mounted on the large printed board.

3. The I/O pin according to claim 2, wherein the small printed board is a multichip module on which at least one bare chip is mounted, the large printed board is a mother board and the I/O pin is formed into a rod-shape.

4. The I/O pin according to claim 1 wherein the first covering layer of low solder wettability comprises Nickel.

5. The I/O pin according to claim 1, wherein the solder dam is composed of a first covering layer comprising high-temperature solder arranged on an outer circumference of the intermediate portion of the I/O pin.

6. The I/O pin according to claim 1, further comprising a rod-like portion and a larger diameter end portion wherein said solder dam is arranged to prevent solder from flowing from one end to the larger diameter end portion.

7. The I/O pin according to claim 1, wherein said solder dam is arranged only in an intermediate portion of the I/O pin.

8. An I/O pin for connecting substrates, comprising:
   an electrically conductive straight body,
   the intermediate portion of which is a large diameter portion relative to the other sections of said I/O pin;
   a first covering layer made of material of low solder wettability arranged on an outer circumference of the body;
   a second covering layer made of material of high solder wettability arranged on an outer circumference of the first covering layer, a portion of the electrically conductive body being exposed from the second covering layer; and
   a solder dam capable of preventing solder from flowing from one end to the other end of the I/O pin in a longitudinal direction, the solder dam being arranged in an intermediate portion of the I/O pin in the longitudinal direction, said solder dam comprising said portion of said first covering layer exposed from said second material layer.

9. An I/O pin for connecting substrates, comprising:
   an electrically conductive straight body,
   an intermediate portion of which is a large diameter portion relative to the other sections of said I/O pin said body being made of material of high solder wettability;
   a first covering layer made of material of high solder wettability arranged on an outer circumference of the body, said large diameter portion of the electrically conductive body being exposed from the first covering layer; and
   a solder dam capable of preventing solder from flowing from one end to the other end of the I/O pin in a longitudinal direction, the solder dam being arranged in an intermediate portion of the I/O pin in the longitudinal direction, said solder dam comprising said large diameter portion of said body exposed from said first covering layer.

10. A printed board comprising at least one I/O pin used for electrically connecting substrates, said I/O pin comprising:
    an electrically conductive straight body;
    a first covering layer made of material of low solder wettability arranged on an outer circumference to the body;
    a second covering layer made of material of high solder wettability arranged on an outer circumference of the first covering layer, a portion of the first covering layer being exposed from the second covering layer in the intermediate portion of the I/O pin; and
    a solder dam capable of preventing solder from flowing from one end to the other end of the I/O pin in a longitudinal direction, the solder dam being arranged in an intermediate portion of the I/O pin in the longitudinal direction, said solder dam comprising said first portion of said first covering layer exposed from said second material layer.

11. A printed board comprising at least one I/O pin used for electrically connecting substrates, said I/O pin comprising:
    an electrically conductive straight body,
    the intermediate portion of which is a large diameter portion relative to the other sections of said I/O pin;
    a first covering layer made of material of low solder wettability arranged on an outer circumference of the body;
    a second covering layer made of material of high solder wettability arranged on an outer circumference of the first covering layer, a portion of the electrically conductive body being exposed from the second covering layer; and
    a solder dam capable of preventing solder from flowing from one end to the other end of the I/O pin in a longitudinal direction, the solder dam being arranged in an intermediate portion of the I/O pin in the longitudinal direction, said solder dam comprising said portion of said first covering layer exposed from said second material layer.

12. A printed board comprising at least one I/O pin used for electrically connecting substrates, said I/O pin comprising:
    an electrically conductive straight body,
    the intermediate portion of which is a large diameter portion relative to the other sections of said I/O pin said body being made of material of high solder wettability;

a first covering layer made of material of high solder wettability arranged on an outer circumference of the body, said large diameter portion of the electrically conductive body being exposed from first covering layer; and a solder dam capable of preventing solder from flowing from one end to the other end of the I/O pin in a longitudinal direction, the solder dam being arranged in an intermediate portion of the I/O pin in the longitudinal direction, said solder dam comprising said large diameter portion of said body exposed from said first covering layer.

* * * * *